(12) United States Patent
Song et al.

(10) Patent No.: US 7,786,783 B2
(45) Date of Patent: Aug. 31, 2010

(54) DUTY CYCLE CORRECTION CIRCUIT WITH REDUCED CURRENT CONSUMPTION

(75) Inventors: Hee-Woong Song, Ichon (KR); Yong-Ju Kim, Ichon (KR); Sung-Woo Han, Ichon (KR); Jae-Min Jang, Ichon (KR); Hyung-Soo Kim, Ichon (KR); Ji-Wang Lee, Ichon (KR); Chang-Kun Park, Ichon (KR); Ic-Su Oh, Ichon (KR); Hae-Rang Choi, Ichon (KR); Tae-Jin Hwang, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/333,193

(22) Filed: Dec. 11, 2008

(65) Prior Publication Data

US 2009/0206901 A1    Aug. 20, 2009

(30) Foreign Application Priority Data

Feb. 19, 2008    (KR) .................. 10-2008-0014698

(51) Int. Cl.
    H03K 3/017    (2006.01)
(52) U.S. Cl. .................. 327/175; 327/172
(58) Field of Classification Search .................. None
    See application file for complete search history.

(56) References Cited

U.S. PATENT DOCUMENTS

| | | | | |
|---|---|---|---|---|
| 5,896,053 A * | 4/1999 | Prentice | | 327/255 |
| 6,967,514 B2 * | 11/2005 | Kizer et al. | | 327/175 |
| 7,015,739 B2 * | 3/2006 | Lee et al. | | 327/175 |
| 7,126,419 B2 * | 10/2006 | Miyasita | | 330/69 |
| 7,177,895 B2 * | 2/2007 | Na et al. | | 708/819 |
| 7,180,346 B2 * | 2/2007 | Lee | | 327/175 |
| 7,183,824 B2 * | 2/2007 | Park et al. | | 327/172 |
| 7,271,623 B2 | 9/2007 | Palmer | | |
| 7,307,461 B2 * | 12/2007 | Nguyen et al. | | 327/172 |
| 7,321,259 B1 * | 1/2008 | Shumarayev | | 330/9 |
| 7,501,870 B2 * | 3/2009 | Choi et al. | | 327/175 |
| 7,528,668 B2 * | 5/2009 | Kim et al. | | 331/45 |
| 7,541,852 B2 * | 6/2009 | Johnson | | 327/175 |
| 7,605,660 B1 * | 10/2009 | Kobayashi | | 330/308 |
| 7,612,593 B2 * | 11/2009 | Kim et al. | | 327/175 |
| 7,629,833 B2 * | 12/2009 | Kim et al. | | 327/538 |
| 2007/0159434 A1 * | 7/2007 | Yen et al. | | 345/92 |

FOREIGN PATENT DOCUMENTS

| JP | 19329924 | 12/2007 |
|---|---|---|
| KR | 1020050083423 | 8/2005 |

* cited by examiner

*Primary Examiner*—Cassandra Cox
(74) *Attorney, Agent, or Firm*—Baker & McKenzie LLP

(57) ABSTRACT

A duty cycle correction circuit includes a signal generating unit including a first signal generating unit coupled to a power supply voltage terminal and configured to output a complementary output signal of an output signal in response to a clock signal, and a second signal generating unit coupled to the power supply voltage terminal and configured to output the output signal in response to a complementary clock signal of the clock signal; a variable resistor unit coupled between the first and second signal generating units configured to vary an amount of current flowing into the signal generating unit according to a duty correction control signal, the duty correction control signal having a voltage level determined based on a voltage level of the output signal; and a current source coupled between the variable resistor unit and a ground voltage terminal configured to supply current to the signal generating unit.

24 Claims, 5 Drawing Sheets

DUTY CYCLE CORRECTION CIRCUIT WITH REDUCED CURRENT CONSUMPTION

CROSS-REFERENCES TO RELATED APPLICATION

The present application claims priority under 35 U.S.C. §119(a) to Korean application number 10-2008-0014698, filed on Feb. 19, 2008, in the Korean Intellectual Property Office, which is incorporated herein by reference in its entirety as if set forth in full.

BACKGROUND

1. Technical Field

The embodiments disclosed herein relate to a semiconductor integrated circuit and, more particularly, to a duty cycle correction circuit of a semiconductor integrated circuit.

2. Related Art

In general, a semiconductor integrated circuit includes a clock signal controlled such that the duty cycle of the clock signal is held to 50%. In the case where the duty cycle of the clock signal is not 50%, a duty cycle correction circuit is required to correct the distorted clock signal.

FIG. 1 is a schematic block diagram of a conventional duty cycle correction circuit. In FIG. 1, the duty cycle correction circuit 1 includes a first differential amplifier 10 and a second differential amplifier 20. The first differential amplifier 10 includes a first resistor R1, a second resistor R2, a first NMOS transistor N1, a second NMOS transistor N2, and a first current source CS1. In addition, the second differential amplifier 20 includes a third NMOS transistor N3, a fourth NMOS transistor N4, and a second current source CS2.

The first differential amplifier 10 buffers and amplifies an external supply voltage VDD with respect to a clock signal 'clk' and a complementary clock signal 'clkb', which is out of phase with the clock signal 'clk', and then outputs an output signal 'out' and a complementary output signal 'outb', which is out of phase with the output signal 'out'. The second differential amplifier 20 receives duty control signals 'dcc' and 'dccb' based on a voltage difference between the output signal 'out' and the complementary output signal 'outb', and then controls voltage levels of first and second nodes (Node1) and (Node2) at which the output signal 'out' and the complementary output signal 'outb' are output, respectively. The duty cycles of the clock signal 'clk' and the complementary clock signal 'clkb' are controlled by changing the voltage levels of the output signal 'out' and the complementary output signal 'outb'.

In FIG. 1, the duty cycle correction circuit 1 employs a pair of differential amplifiers 10 and 20 to correct the duty cycle, wherein the first differential amplifier 10 is used only as a buffer. When the second differential amplifier 20 is connected in parallel with the first differential amplifier 10, the two differential amplifiers function as the duty cycle correction circuit. Accordingly, since current sources, i.e., a first current source and a second current source, are needed for the differential amplifiers 10 and 20, respectively, current consumption is increased.

SUMMARY

A duty cycle correction circuit capable of reducing current consumption is disclosed herein.

In one aspect, a duty cycle correction circuit includes a signal generating unit, including a first signal generating unit coupled to a power supply voltage terminal and configured to output a complementary output signal of an output signal in response to a clock signal, and a second signal generating unit coupled to the power supply voltage terminal and configured to output the output signal in response to a complementary clock signal of the clock signal; a variable resistor unit coupled between the first and second signal generating units configured to vary an amount of current flowing into the signal generating unit according to a duty correction control signal, the duty correction control signal having a voltage level determined based on a voltage level of the output signal; and a current source coupled between the variable resistor unit and a ground voltage terminal configured to supply current to the signal generating unit.

In another aspect, a duty cycle correction circuit includes a plurality of signal generating units configured to output a complementary output signal of an output signal in response to a clock signal and to output the output signal in response to a complementary clock signal of the clock signal, a variable resistor unit coupled to the plurality of signal generating units configured to vary an amount of current flowing into the plurality signal generating unit according to a duty correction control signal, and a current source coupled between the variable resistor unit and a ground voltage terminal configured to supply current to the plurality of signal generating units, wherein the duty correction control signal has a voltage level determined based on a voltage level of the output signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
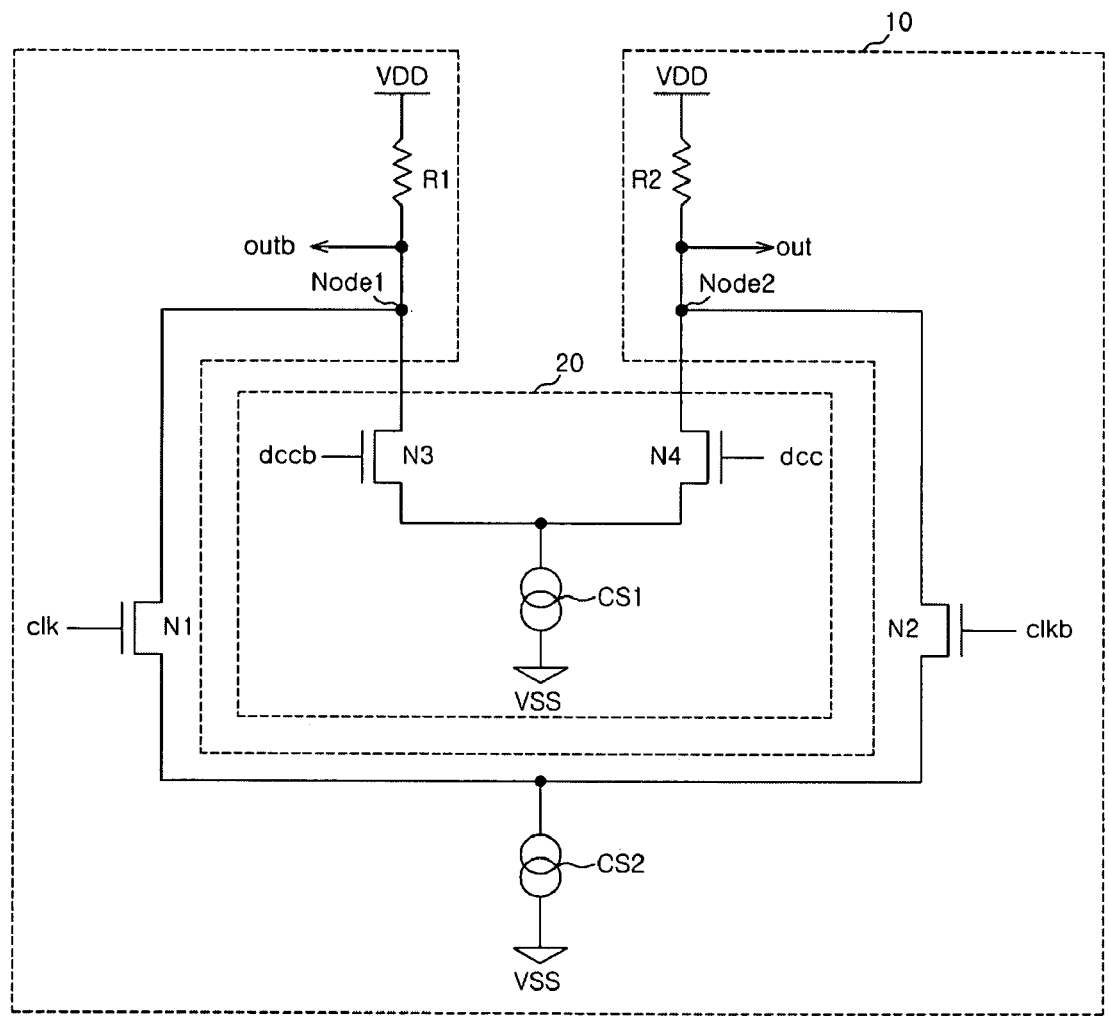
FIG. 1 is a schematic block diagram of a conventional duty cycle correction circuit.
Figure 2:
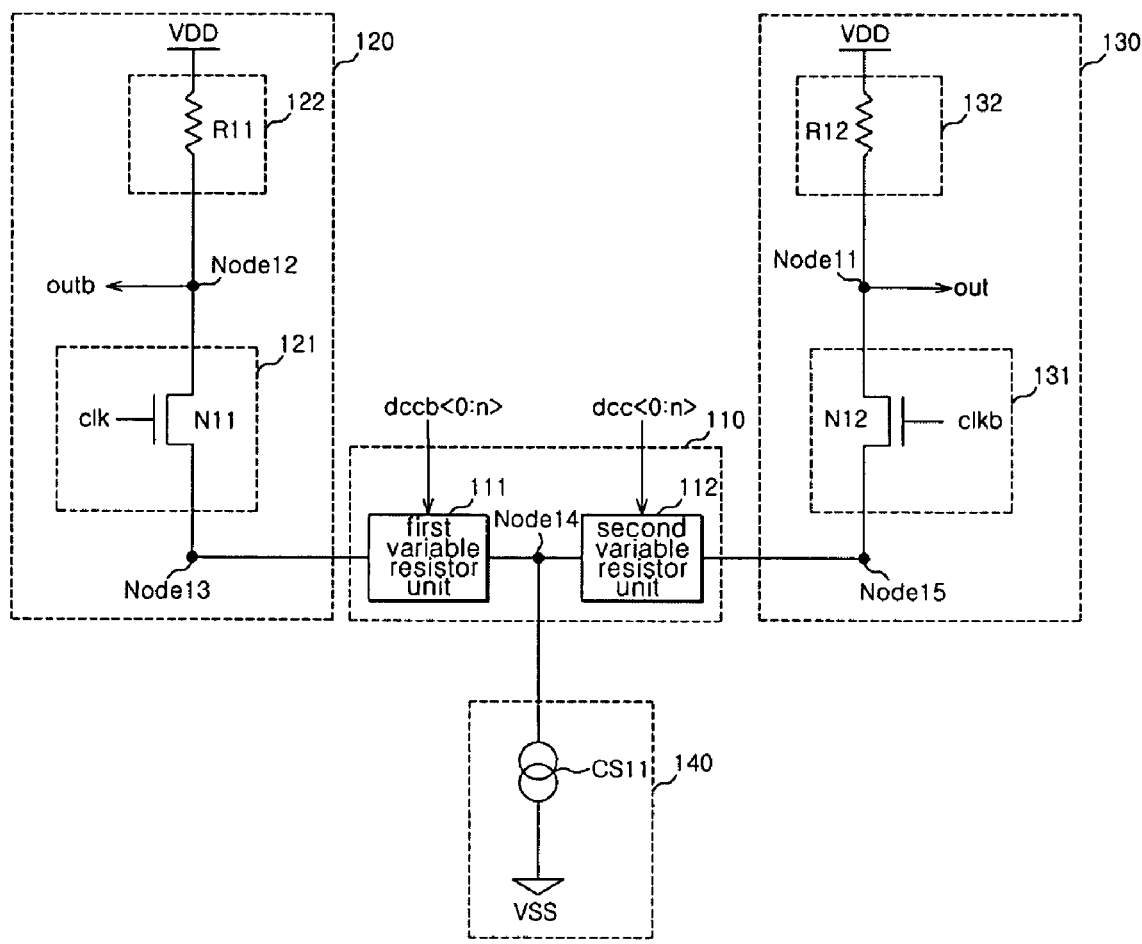
FIG. 2 is a schematic circuit diagram of an exemplary duty cycle correction circuit according to one embodiment.

FIG. 2 is a schematic circuit diagram of an exemplary duty cycle correction circuit 100 according to one embodiment. In FIG. 2, the duty cycle correction circuit 100 can include a first signal generating unit 120 coupled to a power supply voltage terminal VDD, a variable resistor unit 110 coupled to the first signal generating unit 120, a second signal generating unit 130 coupled between the variable resistor unit 110 and the power supply voltage terminal VDD, and a current source (CS11, 140) coupled between the variable resistor unit 110 and a ground voltage terminal VSS.

The first signal generating unit 120, which can output a complementary output signal 'outb' of an output signal 'out' in response to a clock signal 'clk', can include a first load unit 122 and a first input unit 121. The first load unit 122 can include a first resistor R11 coupled between the power supply voltage terminal VDD and a second node (Node12) at which the complementary output signal 'outb' can be output. In addition, the first input unit 121 can include a transfer element in which an amount of current can be varied based on the voltage level of the clock signal 'clk'. For example, the first input unit 121 can be a first NMOS transistor N11 having a gate terminal receiving the clock signal 'clk', a source terminal connected to a third node (Node13), and a drain terminal connected to the second node (Node12).

Conversely, the second signal generating unit 130, which can output the output signal 'out' in response to the complementary clock signal 'clkb', can include a second load unit 132 and a second input unit 131. For example, the second load unit 132 can include a second resistor R12 coupled between the power supply voltage terminal VDD and a first node (Node11) at which the output signal 'outb' can be output. In addition, the second input unit 131 can include a transfer element in which an amount of current can be varied based on the voltage level of the complementary clock signal 'clkb'. For example, the second input unit 131 can be a second NMOS transistor N12 having a gate terminal receiving the complementary clock signal 'clkb', a source terminal connected to a fifth node (Node15), and a drain terminal connected to the first node (Node11).

In FIG. 2, the variable resistor unit 110 can vary an amount of current flowing into the first and second signal generating units 120 and 130 in response to a duty correction control signal 'dcc<0:n>' and a complementary signal 'dccb<0:n>', which can be determined based on the voltage levels of the output signal 'out' and the complementary output signal 'outb'. Here, the first signal generating unit 120 can be connected in series with the signal generating unit 130 through the variable resistor unit 110. For example, the variable resistor unit 110 can include a first variable resistor unit 111 coupled between the third node (Node13) and a fourth node (Node14), and a second variable resistor unit 112 coupled between the fourth node (Node14) and the fifth node (Node15). In addition, the current source 140 can be coupled between the fourth node (Node14) and the ground voltage terminal VSS, and can vary an amount of current that can flow into the first and second variable resistor units 111 and 112 in response to the duty correction control signal 'dcc<0:n>' and a complementary duty correction control signal 'dccb<0:n>', respectively.

Accordingly, reference voltage levels (to determine a high or low level of a signal) of the output signal 'out' and the complementary output signal 'outb' can be differently controlled base on a difference in amount of DC currents flowing into the first and second resistors R11 and R12. Thus, as shown by chart (b) of FIG. 3, a distorted duty cycle of the clock signal can be adjusted so that the clock signal has the 50% duty cycle.

Figure 3:
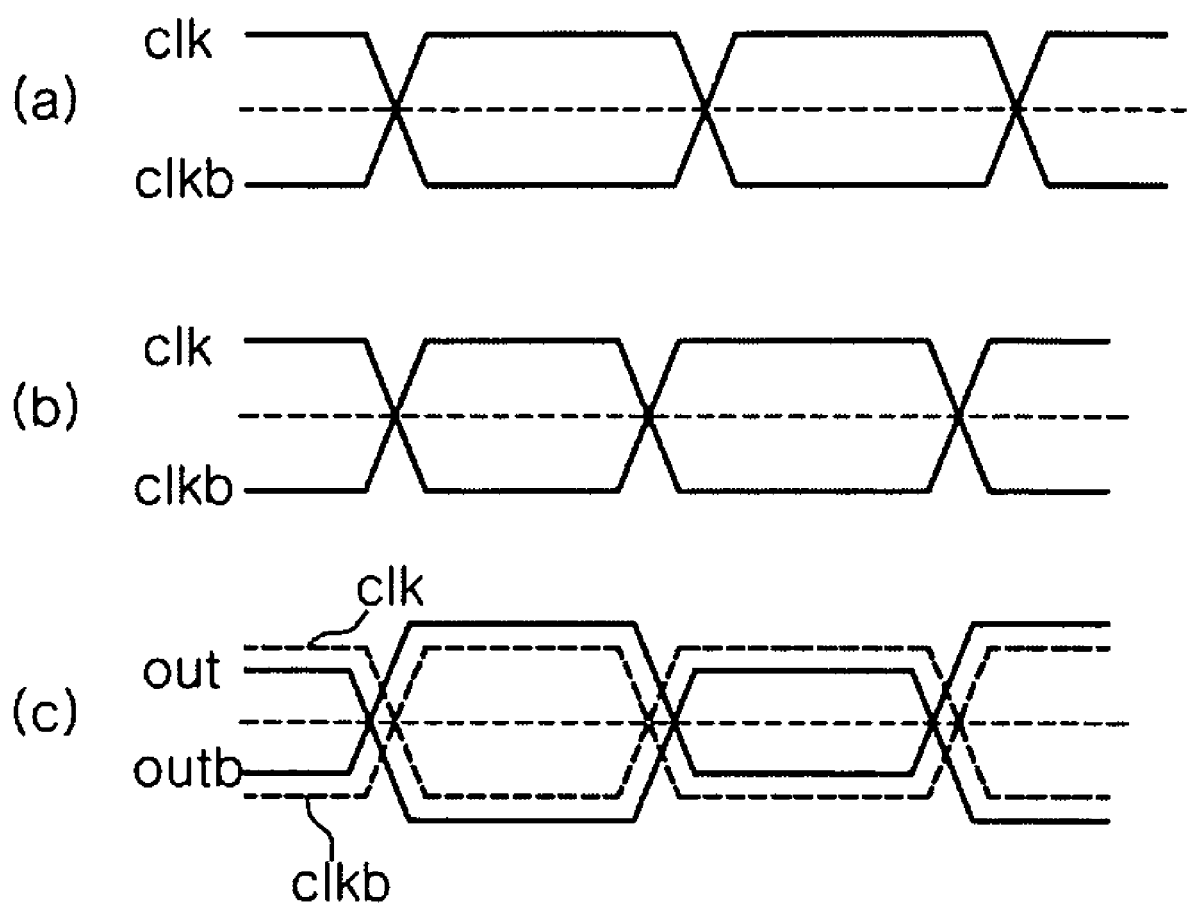
FIG. 3 is a timing chart demonstrating exemplary clock and output signals according to one embodiment.

FIG. 3 is a timing chart demonstrating exemplary clock and output signals according to one embodiment. In FIG. 3, chart (a) shows the clock signal 'clk' and the complementary clock signal 'clkb' with 50% duty cycle, chart (b) shows the clock signal 'clk' and the complementary clock signal 'clkb' with a distorted duty cycle, and chart (c) shows the output signal 'out' and the complementary output signal 'outb' of which the duty cycles are corrected. At chart (c) of FIG. 3, the solid lines show the output signal 'out' and the complementary output signal 'outb' after the correction of the 50% duty cycle, and the dotted lines show the clock signal 'clk' and the complementary clock signal 'clkb' with the distorted duty cycle shown in chart (b) of FIG. 3.

Figure 4:
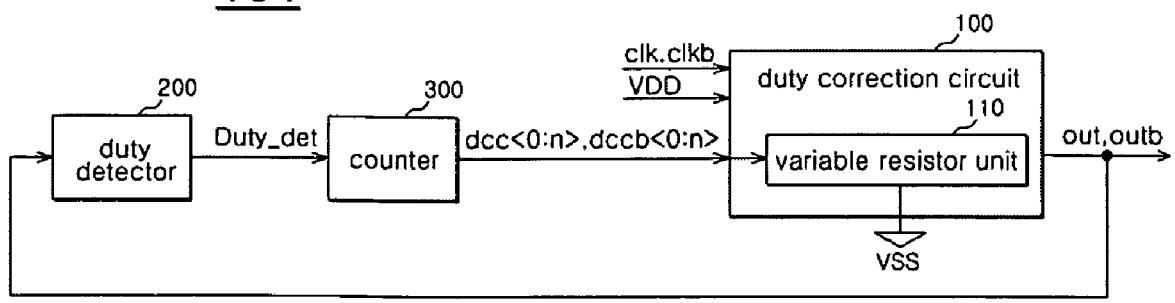
FIG. 4 is a schematic diagram of an exemplary semiconductor integrated circuit capable of implementing the duty cycle correction circuit of FIG. 2 according to one embodiment.

FIG. 4 is a schematic diagram of an exemplary semiconductor integrated circuit 101 capable of implementing the duty cycle correction circuit of FIG. 2 according to one embodiment. In FIG. 4, the semiconductor integrated circuit 101 can include a duty detector 200, a counter 300, and the duty correction circuit 100 having the variable resistor unit 110.

The duty detector 200 can detect the voltage levels of the output signal 'out' and the complementary output signal 'outb' in order to output a duty detection signal 'Duty_det'. For example, the duty detector 200 can be implemented by a digital circuit or an analog circuit. Preferably, the duty detector 200 can be digitally implemented with a high area efficiency and without circuit complexity. Accordingly, for convenience of illustration, an exemplary digital duty cycle correction circuit will be described.

The counter 300 can receive and count the duty detection signal 'Duty_det', and then output the duty correction control signal 'dcc<0:n>' and the complementary duty correction control signal 'dccb<0:n>'. Here, the counter 300 can sequentially increase or decrease the output signals on a one-by-one basis, thereby producing the duty correction control signal 'dcc<0:n>' and the complementary duty correction control signal 'dccb<0:n>' having (n+1) bits, wherein n is an integer. For example, the counter 300 can increase the output signals on the one-by-one basis when the duty detection signal 'Duty_det' is at a high level, and can decrease the output signals on the one-by-one basis when the duty detection signal 'Duty_det' is at a low level.

Conversely, the duty correction circuit 100 (in FIG. 2) can adjust the voltage levels of the output signal 'out' and the complementary output signal 'outb' in response to the clock signals 'clk' and 'clkb'. As described above, the variable resistor unit 110, which can be included in the duty correction circuit 100, can vary the amount of current flowing into the duty correction circuit 100 based on the duty correction control signal 'dcc<0:n>' and the complementary duty correction control signal 'dccb<0:n>', which can be determined by the voltage level of the output signal 'out'. Moreover, the duty correction circuit 100 (in FIG. 2) can adjust a voltage level of the output signal 'out' and the complementary output signal 'outb' based on an amount of current fluctuated by the variable resistor unit 110.

Figure 5:
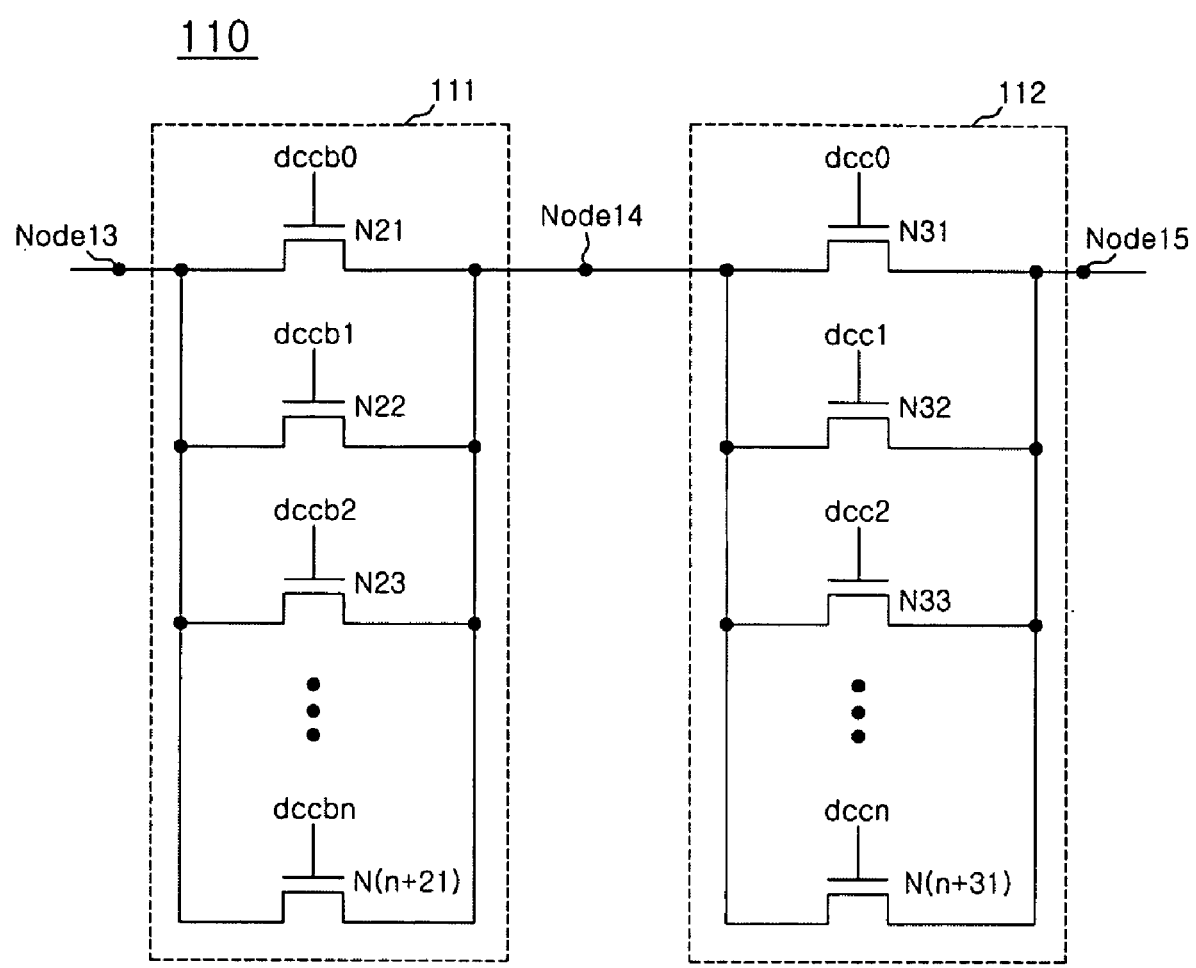
FIG. 5 is a schematic circuit diagram of an exemplary variable resistor unit capable of being implemented in the circuit of FIG. 2 according to one embodiment.

FIG. 5 is a schematic circuit diagram of an exemplary variable resistor unit 110 capable of being implemented in the circuit of FIG. 2 according to one embodiment. In FIG. 5, the first variable resistor unit 111 can be configured to include a plurality of transfer elements that can be turned ON in response to the complementary duty correction signal 'dccb<0:n>' of an (n+1)-number of bits, respectively. Similar to the first variable resistor unit 111, the second variable resistor unit 112 can be configured to include a plurality of transfer elements that can be turned ON in response to the duty correction signal 'dcc<0:n>' of an (n+1)-number of bits, respectively.

The transfer elements in the first variable resistor unit 111, which can be coupled in parallel to each other between the third node (Node13) and the fourth node (Node14), can be configured to include an (n+1)-number of NMOS transistors N21 to N(n+21), each having gate terminal receiving the complementary duty correction signal 'dccb<0:n>' of an (n+1)-number of bits, respectively. Similarly, the transfer elements in the second variable resistor unit 112, which can be coupled in parallel to each other between the fourth node (Node14) and the fifth node (Node15) can be configured to include an (n+1)-number of NMOS transistors N31 to N(n+31), each having gate terminals receiving the duty correction signal 'dcc<0:n>' of an (n+1)-number of bits, respectively.

An exemplary operation of the duty cycle correction circuit will be described. If the duty cycle of the output signal 'out' is about 60% and the duty cycle of the complementary output signal 'outb' is about 40%, then the duty detector 200 (in FIG. 4) can output the duty detection signal 'Duty_det' at a high level and the counter 300 can increase the duty correction signal 'dcc<0:n>' of an (n+1)-number of bits by --1--. For example, the duty correction signal 'dcc<0:n>' can transition from --000000-- to --000001--. Accordingly, one NMOS transistor can be further turned ON with the increase of the duty correction signal 'dcc<0:n>' that transitions from --000000-- to --000001--. In addition, the resistance value is decreased with the increase of the number of the turned-ON transistors. Thus, a relatively large amount of current flows into the second resistor R12. As a result, the DC voltage level on the first node (Node11) can be reduced by the voltage drop at the second resistor R12, and the reference level of the output signal 'out' can be decreased.

In contrast to the first node (Node11), since the DC voltage level on the second node (Node12) can increase, the reference level of the complementary output signal 'outb' can increase. Thus, as shown in chart (c) of FIG. 3, the voltage level of the output signal 'out' can decrease, the voltage level of the complementary output signal 'outb' can increase, and then the duty cycle of the clock signal 'clk' can be corrected.

As the output signals 'out' and 'outb', which can have corrected voltage levels, are corrected are fed back to the duty detector 200, the duty detector 200 can again detect the voltage levels of the output signals 'out' and 'outb' and then again output the duty detection signal 'Duty_det'. If the duty cycle of the clock signal clk is about 55%, then the duty detector 200 can output the duty detection signal 'Duty_det' at a high level since the corrected duty cycle is still not about 50%. Accordingly, the counter 300 can increase the output signal of an (n+1)-number of bits once more to generate the duty correction signal 'dcc<0:n>' of --000010--. Since the number of turned-ON NMOS transistors in the second variable resistor unit 112 is less than the number of turned-ON NMOS transistors in the first variable resistor unit 111, the voltage level on the first node (Node11) can be further reduced, and the reference level of the output signal 'out' can be decreased.

In contrast to the output signal 'out', the reference level of the complementary output signal 'outb' can also be increased. As a result, as the duty cycle of the clock signal 'clk' is decreased from about 55% to about 50%, and the duty cycle of the complementary clock signal 'clkb' is increased from about 45% to about 50%, the 50% duty cycle of the clock signal 'clk' can be achieved.

Accordingly, as detailed above, the number of current sources can be reduced so that current consumption can be reduced and the correction of the duty cycle can be normally carried out.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A duty cycle correction circuit, comprising:
    a signal generating unit, including
        a first signal generating unit configured to output a complementary output signal of an output signal in response to a clock signal, and
        a second signal generating unit configured to output the output signal in response to a complementary clock signal of the clock signal;
    a variable resistor unit coupled between the first and second signal generating units, the variable resistor configured to vary an amount of current flowing into the signal generating unit according to a duty correction control signal, the duty correction control signal having a voltage level determined based on a voltage level of the output signal;
    a current source coupled between the variable resistor unit and a ground voltage terminal configured to supply current to the signal generating unit;
    a duty detector configured to output a duty detection signal by detecting voltage levels of the output signal and the complementary output signal; and
    a counter configured to receive the duty detection signal and output the duty correction control signal.

2. The duty cycle correction circuit of claim 1, wherein the first and second signal generating units are coupled to a power supply voltage.

3. The duty cycle correction circuit of claim 1, wherein the signal generating unit is configured to adjust a voltage level of the output signal by using a voltage level between the output signal and a reference voltage and between the complementary output signal and the reference voltage.

4. The duty cycle correction circuit of claim 2, wherein the first signal generating unit includes:
    a first load unit coupled between the power supply voltage terminal and a first node, the first load unit configured to output the complementary output signal through the first node; and
    a first input unit coupled to the first node and driven by the clock signal.

5. The duty cycle correction circuit of claim 4, wherein the first input unit includes a transfer element configured to vary an amount of current according to a voltage level of the clock signal.

6. The duty cycle correction circuit of claim 4, wherein the first load unit includes a first resistor coupled between the power supply voltage terminal and the first node.

7. The duty cycle correction circuit of claim 1, wherein the second signal generating unit includes:
    a second load unit coupled between the power supply voltage terminal and a second node, the second load unit configured to output the output signal through the second node; and
    a second input unit coupled to the second node and driven by the complementary clock signal.

8. The duty cycle correction circuit of claim 7, wherein the second input unit includes a transfer element configured to vary an amount of current according to a voltage level of the complementary clock signal.

9. The duty cycle correction circuit of claim 7, wherein the second load unit includes a second resistor coupled between the power supply voltage terminal and the second node.

10. The duty cycle correction circuit of claim 1, wherein the variable resistor unit is coupled between the second signal generating unit and the current source.

11. The duty cycle correction circuit of claim 10, wherein the variable resistor unit includes a first variable resistor unit configured to have a resistance value varied according to the duty correction control signal.

12. The duty cycle correction circuit of claim 11, wherein the first variable resistor unit includes a plurality of transfer elements coupled in parallel to each other and driven in response to the duty correction control signal.

13. The duty cycle correction circuit of claim 12, wherein the plurality of transfer elements include transistors that have gate terminals to which an (n+1)-number of bit signals of the duty correction control signal are supplied, respectively, wherein n is a natural number.

14. The duty cycle correction circuit of claim 11, wherein the variable resistor unit is coupled between the first signal generating unit and the current source.

15. The duty cycle correction circuit of claim 13, wherein the variable resistor unit further includes a second variable resistor unit configured to have a resistance value varied according to the duty correction control signal.

16. The duty cycle correction circuit of claim 15, wherein the second variable resistor unit includes a plurality of transfer elements coupled in parallel coupled to each other and driven in response to a complementary signal of the duty correction control signal.

17. The duty cycle correction circuit of claim 16, wherein the plurality of transfer elements include transistors each having gate terminals to which an (n+1)-number of bit signals of the complementary signal of the duty correction control signal are supplied, respectively, wherein n is a natural number.

18. A duty cycle correction circuit, comprising:
a plurality of signal generating units configured to output a complementary output signal of an output signal in response to a clock signal and to output the output signal in response to a complementary clock signal of the clock signal;
a variable resistor unit coupled to the plurality of signal generating units configured to vary an amount of current flowing into the plurality of signal generating units according to a duty correction control signal;
a current source coupled between the variable resistor unit and a ground voltage terminal configured to supply current to the plurality of signal generating units;
a duty detector configured to output a duty detection signal by detecting voltage levels of the output signal and the complementary output signal; and
a counter configured to receive the duty detection signal and output the duty correction control signal.

19. The duty cycle correction circuit of claim 18, wherein the plurality of signal generating units includes a first signal generating unit coupled to a power supply voltage terminal and configured to output the complementary output signal of the output signal in response to the clock signal, and a second signal generating unit coupled to the power supply voltage terminal and configured to output the output signal in response to the complementary clock signal of the clock signal.

20. The duty cycle correction circuit of claim 19, wherein the first signal generating unit includes a first load unit coupled between the power supply voltage terminal and a first node configured to output the complementary output signal through the first node, and a first input unit coupled to the first node and driven by the clock signal.

21. The duty cycle correction circuit of claim 20, wherein the first load unit includes a first resistor coupled between the power supply voltage terminal and the first node, and the first input unit includes a transfer element configured to vary an amount of current according to a voltage level of the clock signal.

22. The duty cycle correction circuit of claim 19, wherein the second signal generating unit includes a second load unit coupled between the power supply voltage terminal and a second node configured to output the output signal through the second node, and a second input unit coupled to the second node and driven by the complementary clock signal.

23. The duty cycle correction circuit of claim 22, wherein the second load unit includes a second resistor coupled between the power supply voltage terminal and the second node, and the second input unit includes a transfer element configured to vary an amount of current according to a voltage level of the complementary clock signal.

24. The duty cycle correction circuit of claim 18, wherein the variable resistor unit includes a plurality of transistor, each having a gate terminal receiving an (n+1)-number of bit signals of one of the duty correction control signal and a complementary signal of the duty correction control signal, wherein n is a natural number.

* * * * *